US012666767B2

(12) United States Patent
Guo et al.

(10) Patent No.: US 12,666,767 B2
(45) Date of Patent: Jun. 23, 2026

(54) ULED DISPLAY DESIGN METHOD BASED ON NANOWIRE

(71) Applicants: FUZHOU UNIVERSITY, Fuzhou (CN); MINDU INNOVATION LAB, Fuzhou (CN)

(72) Inventors: Tailiang Guo, Fuzhou (CN); Zongzhao Jiang, Fuzhou (CN); Yun Ye, Fuzhou (CN); Qun Yan, Fuzhou (CN); Hongxing Xie, Fuzhou (CN); Jianmin Yao, Fuzhou (CN)

(73) Assignees: FUZHOU UNIVERSITY, Fuzhou (CN); MINDU INNOVATION LAB, Fujian (CN)

( * ) Notice: Subject to any disclaimer, the term of this patent is extended or adjusted under 35 U.S.C. 154(b) by 250 days.

(21) Appl. No.: 17/768,490

(22) PCT Filed: Aug. 31, 2020

(86) PCT No.: PCT/CN2020/112403
§ 371 (c)(1),
(2) Date: Apr. 13, 2022

(87) PCT Pub. No.: WO2021/073288
PCT Pub. Date: Apr. 22, 2021

(65) Prior Publication Data
US 2024/0297282 A1      Sep. 5, 2024

(30) Foreign Application Priority Data
Oct. 16, 2019    (CN) ........................ 201910984750.X

(51) Int. Cl.
| | |
|---|---|
| *H10H 20/81* | (2025.01) |
| *H01L 25/16* | (2023.01) |
(Continued)

(52) U.S. Cl.
CPC ....... *H10H 20/8506* (2025.01); *H01L 25/167* (2013.01); *H10H 20/018* (2025.01);
(Continued)

(58) Field of Classification Search
CPC ......... H01L 2933/0066; H01L 33/0093; H01L 33/00–648; B82Y 20/00; H10K 59/00–95
See application file for complete search history.

(56) References Cited

U.S. PATENT DOCUMENTS

| | | | |
|---|---|---|---|
| 9,570,425 B2 * | 2/2017 | Do | .................... G02F 1/133603 |
| 2003/0170971 A1 * | 9/2003 | Tomoda | .................. H01L 24/82 |
| | | | 438/46 |

(Continued)

*Primary Examiner* — Matthew C Landau
*Assistant Examiner* — Jesse S Kysar
(74) *Attorney, Agent, or Firm* — Jose Cherson Weissbrot

(57) ABSTRACT

The present invention relates to a μLED display design method based on nanowire. The method comprises: first, growing different nanowire materials capable of generating three primary colors: red, green and blue on a substrate; then, respectively dissolving the different nanowire materials in insulated photocuring adhesives and injecting the mixtures into different grids of a grid pool, and performing curing; and finally, arranging electrodes on upper and lower surfaces of the grid pool. The method provided by the present invention can simplify the structure and enhance the industrial efficiency of the μLED.

8 Claims, 5 Drawing Sheets

(51) Int. Cl.

| | |
|---|---|
| *H10H 20/01* | (2025.01) |
| *H10H 20/811* | (2025.01) |
| *H10H 20/85* | (2025.01) |
| *H10H 20/855* | (2025.01) |
| *H10H 20/857* | (2025.01) |

(52) U.S. Cl.

CPC .......... *H10H 20/81* (2025.01); *H10H 20/811* (2025.01); *H10H 20/855* (2025.01); *H10H 20/857* (2025.01); *H10H 20/032* (2025.01); *H10H 20/0363* (2025.01); *H10H 20/0364* (2025.01)

(56) References Cited

U.S. PATENT DOCUMENTS

| | | | |
|---|---|---|---|
| 2006/0273328 A1* | 12/2006 | Niu ......................... | H01L 33/24 |
| | | | 257/79 |
| 2013/0200391 A1* | 8/2013 | Bedair ................... | H01L 33/22 |
| | | | 438/494 |
| 2022/0254760 A1* | 8/2022 | Kundaliya ........... | H01L 27/153 |

* cited by examiner

40

ULED DISPLAY DESIGN METHOD BASED ON NANOWIRE

BACKGROUND OF THE INVENTION

1. Technical Field

The present invention relates to the field of LED design, particularly to a µLED display design method based on nanowire.

2. Description of Related Art

In the technical field of panel display, µLED has many advantages, and the most prominent advantages of µLED are low power consumption, higher brightness, ultrahigh definition, higher color saturation, higher response speed, longer service life, higher working efficiency and so on. It can be said that the µLED is a reformed novel display technology and is expected to replace almost all TFT liquid crystal displays applied in the field of panel display.

At present, the production process of µLED still adopts a conventional LED manufacturing mode, the size of a manufactured pn junction material is defined below 100 µm by way of the growth of various thin films, and in the growth process of the lamellar thin films, there is unavoidably a problem of mismatch of crystal lattices, and thus, it is necessary to introduce various buffer layers or functional layers in the manufacturing process of the lamellar µLED to solve the problem of mismatch of crystal lattices and improve the quantum conversion efficiency. Therefore, the lamellar structure becomes more complex. After the µLED is manufactured, it is necessary to cut the µLED into small nano-scaled LED chips and the chips are transferred to a circuit substrate via various mechanical tools. The process takes a lot of time as it is needed to pickup, place and assemble a huge amount of µLED chips. In order to solve the above-mentioned problems so as to improve the industrial efficiency of µLED and simplify the structure, it is an urgent need to develop and design a novel µLED.

BRIEF SUMMARY OF THE INVENTION

For this purpose, the present invention is intended to provide a µLED display design method based on the nanowire. The method can simplify the structure and enhance the industrial efficiency of µLED.

The present invention is realized by adopting the following scheme: a µLED display design method based on nanowire specifically includes: growing different nanowire materials capable of generating three primary colors: red, green and blue on a substrate; respectively dissolving the different nanowire materials in insulated photocuring adhesives and injecting the mixtures into different grids of a grid pool, and performing curing; and finally, arranging electrodes on upper and lower surfaces of the grid pool. When an addressing signal passes through the corresponding electrode, lightening of corresponding pixels and image display can be completed.

Further, the method specifically includes the following steps:

Step S1: growing the nanowire material for generating a light source for three primary colors: red, green and blue (a craft technique of MOCVD can be utilized), performing electropositive and electronegative tendency treatment on an end, and performing peeling after growth;

Step S2: respectively doping the nanowire material for generating a light source for three primary colors: red, green and blue into the photocuring adhesives and stirring the mixtures fully (including mechanical stirring or magnetic stirring or ultrasonic stirring), and evenly dispersing the nanowire material in the photocuring adhesives to obtain a fully stirred photocuring adhesive-nanowire material adhesive body;

Step S3: respectively injecting the fully stirred photocuring adhesive-nanowire material adhesive body correspondingly into the grids of the grid pool corresponding to sub-pixels of the three primary colors: red, green and blue, and performing photocuring, and cutting off the overflowing cured adhesive bodies by way of laser cutting after photocuring to obtain sub-pixel cured µLEDs, wherein in the process of injecting an adhesive solution mixed with the red, green and blue nanowire materials, the green and blue grid pools, the red and blue grid pools and the red and green grid pools can be shielded respectively, and the overflowing cured adhesive bodies are cut off by way of laser cutting after photocuring; and Step S4: enabling an electrode capable of working under a condition of an alternating current to be in one-to-one-correspondence with the corresponding sub-pixel cured µLEDs on the upper and lower surfaces of the grid pool by way of attaching a chip electrode or growing the electrode, and cutting off the desired display size by way of laser cutting.

Further, the nanowire materials are different homojunction materials of homogeneous structures which grown on the silicon substrate from bottom to top and are capable of generating three primary colors: red, green and blue, the upper and lower ends of the nanowire materials are respectively n and p-doped, two end tops are respectively in electronegative tendency and electropositive tendency, and a hole electron recombination can be generated at a center of a junction of n and p homojunctions.

Further, an inner diameter of the nanowire ranges from 40 nm to 60 nm, and a length thereof ranges from 300 nm and 400 nm, thereby providing a proper contact area for carrier recombination of the pn junction so as to perform the radiative transition.

Further, the Step S1 includes the following steps:

Step S11: cleaning and treating the substrate: ultrasonically cleaning a sample in sequence in deionized water, ethanol and deionized water, removing pollutants left on the surface and blow-drying the sample;

Step S12: putting the substrate in a reaction chamber of a physical vapor deposition device and starting evaporation of a nanowire buffer layer at a certain pressure of the reaction chamber and a temperature of a metal source to solve mismatch between the substrate and the nanowire in an axial direction, wherein the nanowire releases stress-strain caused by mismatch between the substrate and crystal lattices of the nanowire material along a side surface and a direction perpendicular to a junction interface during growth, so that materials with mismatched crystal lattices can be connected in series and grow in a radial direction or an axial direction conveniently; and performing growth of an upright nanowire material after the thin film of the buffer layer grows;

Step S13: putting the substrate covered with the thin film of the buffer layer in a multi-chip HVPE growth system, starting growing the nanowire at a low temperature by taking the substrate as a bottom, and controlling a nanowire material source, n and p-doped gases, a reaction gas, a carrier gas and electropositive and electronegative tendency treatment, wherein the nanowire grows to become a structure of an electropositive tendency p-doped nanowire end-p-doped nanowire-n-doped nanowire-electronegative tendency n-doped nanowire end from bottom to top; and Step S14: cooling the structure to take out a sample so as to obtain the nanowire material.

Further, for sub-pixels with different primary colors, a nanowire growth material is different direct band-gap semiconductor compounds from groups III-V. For example, blue light emitting sub-pixels are GaN, green light emitting sub-pixels are InGaN, red light emitting sub-pixels are GaAs, which is not limited thereto.

Further, the photocuring adhesive is a transparent insulating material. The photocuring adhesive, as a carrier for different nanowire materials with red, green and blue sub-pixels, is an adhesive body at a room temperature and a normal pressure, has certain mobility and can be cured at room temperature. The photocuring adhesive is the transparent insulating material with a great dielectric constant so as to realize transparent display.

The photocuring adhesive material can be used for preparing the transparent insulating photocuring adhesive capable of being quickly cured by ultraviolet light at room temperature from a main component of an oligomer of an unsaturated polyester resin, an acrylic resin and a polythiol/polyenoid resin matched with a proper diluent monomer, a photosensitizer and an auxiliary material.

Further, the grid pool is made from a transparent insulating material. The grid pool is taken as a place where a mixed solution of the photocuring adhesive and the nanowire materials is cured, and meanwhile, each of the grids is taken as a red, green and blue sub-pixel point. The grid pool is the transparent insulating material with a great dielectric constant to realize transparent display.

The electrodes are set as conducting electrodes with sub-pixel units in different primary color at an interval in sequence, and the sizes and the center positions of the electrodes are precisely matched with the sizes and the center positions of the grid pool.

Further, the grids of the grid pool are shaped like a Chinese character "kou", with a length ranged from 16 um to 32 um, a width ranged from 9 um to 18 um and a depth ranged from 9 um to 18 um. The transmittance for rays with wavelengths ranged from 380 nm to 780 nm is greater than or equal to 90%. The material can be an organic material, including one or more of polyethylene (PE), polypropylene (PP), polyethylene naphthalate (PEN), polycarbonate (PC), polymethyl acrylate (PMA), polymethyl methacrylate (PMMA), cellulose acetate butyrate (CAB), siloxane, polyvinyl chloride (PVC), polyvinyl alcohol (PVA), polyethylene terephthalate (PET), polyethylene terephthalate glycol (PETG), polydimethylsiloxane (PDMS) or a cycloene copolymer (COC); or an inorganic material, including one or more of glass, quartz and a transmission ceramic material.

Further, the electrode is a material capable of working under a condition of an alternating current, including, but not limited to, graphene, PEDOT: PPS, and metals silver, platinum or gold. The electrode can be either a chip electrode or a transparent electrode material growing on the μLED subsequently. As the nanowires in the μLED in the design are evenly distributed in the adhesive body, distribution of p-end nanowires and n-end nanwores is unknown, so that the electrode material is a material capable of working under a condition of an alternating current so as to enable the carrier recombination of the pn junction to emit light.

In conclusion, the display design of μLED of the present invention completes electron-hole recombination by utilizing the homogeneous pn junction nanowire materials to generate radiative transition. Compared with the lamellar structure, the nanowire type pn junction is lower in working voltage and higher in inner quantum efficiency. Stress-strain caused by mismatch between the substrate and crystal lattices of the nanowire can be released along the side surface and the direction perpendicular to the junction interface in the growth process of the nanowire, so that limitation by mismatch of the crystal lattices of the lamellar structure is overcome. Meanwhile, in the growth process, various micro-treatment can be performed, so that the work efficiency of the apparatus is improved. The nanowire and the photocuring adhesive are inter-dissolved and are cured in the sub-pixel grid pool after being evenly stirred, so that the structure of the lamellar μLED is simplified. When the sub-pixels are selected, electrons and holes in the insulating photocuring adhesive complete short-distance transition via quantum tunneling and are injected into the nanowire, so that the pn junction generates radiative transition. The end of the nanowire is in electropositive and electronegative tendencies to guide carriers. Thus, the μLED of the structure can work in the state of the alternating current, and the desired display size can be obtained by way of laser cutting, so that there is no problem of massive transfer, the manufacturing period of the μLED is shortened, and the market competitiveness of the μLED is improved greatly.

Compared with the prior art, the present invention has the following beneficial effects:

1. According to the display design method of the μLED provided by the present invention, the sub-pixels are lightened as the carrier recombination of the pn junction of the nanowire material of emits light; different from the planar growth of a conventional μLED, the semiconductor nanowire can release stress-strain caused by mismatch between the substrate and crystal lattices of the nanowire material along the side surface and the direction perpendicular to the junction interface during growth, so that the semiconductor nanowire can grow on a specific substrate to overcome limitation caused by mismatch of the crystal lattices, and can further be designed in various complicated structures conveniently;

2. As the current of a junction array in the nanowire shape is greater than the current of the lamellar junction, the design reduces the working voltage as well. The photocuring adhesives and the nanowires mixed in the grid pool are photocured to form the sub-pixel points, so that the μLED features simple and easily implemented manufacturing process and simpler structure as well.

3. The grids are cut by way of laser cutting, and thus, the desired display size can be obtained, so that there is no problem of massive transfer of the conventional μLED for the display industry.

Figure 1:
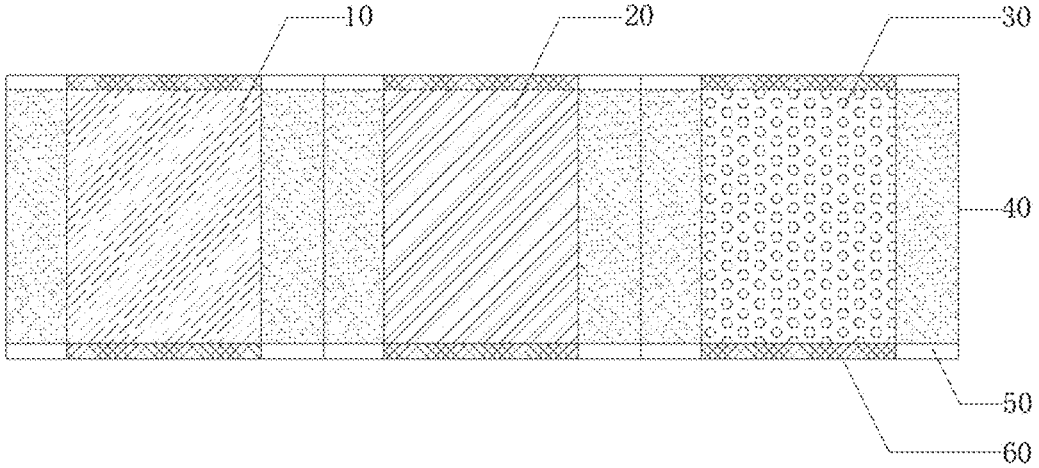
FIG. 1 is a sectional schematic diagram of a μLED display structure designed by a design method in an embodiment of the present invention.

In the drawings, 10—red μLED; 11—substrate; 12—buffer layer; 13—end of nanowire with electropositive tendency; 14—p-type doped nanowire material; 15—nanowire; 16—n-type doped nanowire material; 17—end of nanowire with electronegative tendency; 20—green μLED; 25—photocuring adhesive; 30—blue μLED; 40—grid pool; 50—insulating part of electrode; 60—electrode.

DETAILED DESCRIPTION OF THE INVENTION

Further description of the present invention will be made below in combination with drawings and embodiments.

It is to be noted that the detailed description below is exemplary and is intended to further describe the application. Unless specified otherwise, all technical and scientific terms used herein have the same meaning as commonly understood by those of ordinary skill in the art to which the application belongs.

It is to be noted that the terms used herein are merely to describe specific implementation modes rather than being intended to limit the exemplary implementation modes according to the application. As used herein, unless otherwise specified in the context, the singular form is further intended to include plural form. In addition, it is to be further understood that when the terms "comprise" and/or "include" are used in the description, it indicates that there are features, steps, operations, apparatuses, assemblies and/or their combinations.

Figure 5:
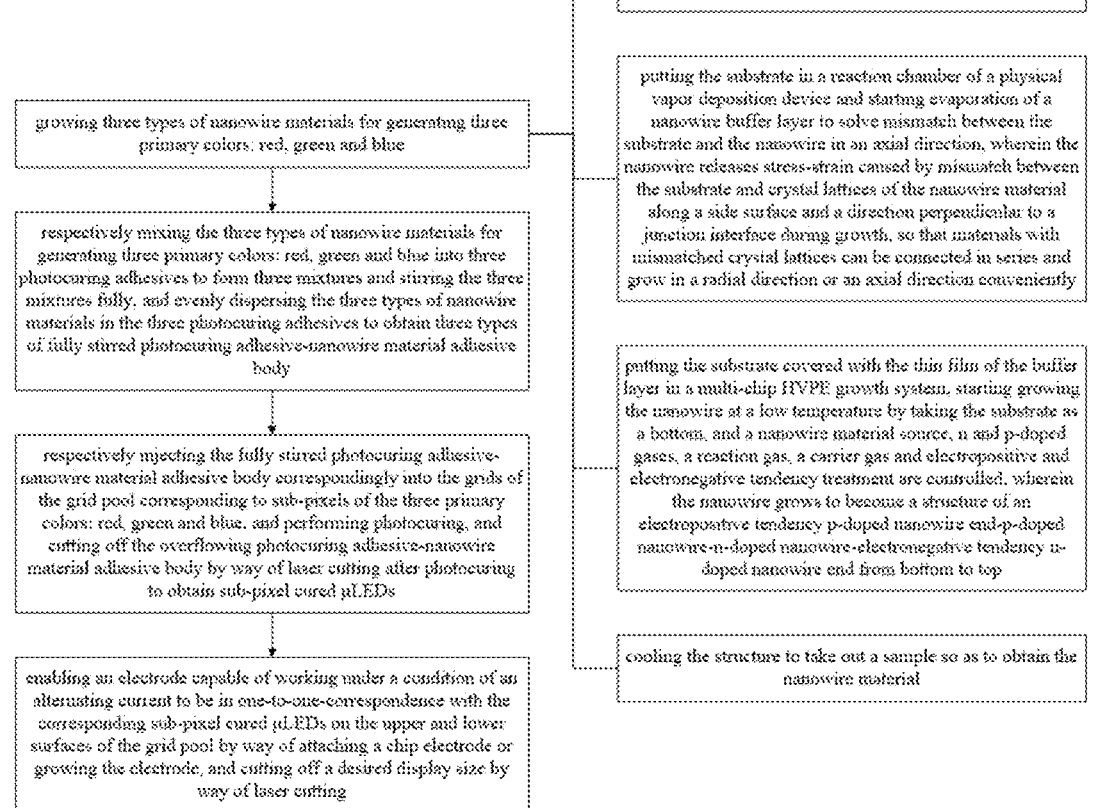
FIG. 5 is a flow schematic diagram of a method in an embodiment of the present invention.

As shown in FIG. 5, the embodiment provides a μLED display design method based on nanowire. The method specifically includes: growing different nanowire materials capable of generating three primary colors: red, green and blue on a substrate; respectively dissolving the different nanowire materials in insulated photocuring adhesives and injecting the mixtures into different grids of a grid pool, and performing curing; and finally, arranging electrodes on upper and lower surfaces of the grid pool. When an addressing signal passes through the corresponding electrode, lightening of corresponding pixels and image display can be completed.

In the embodiment, the method specifically includes the following steps:

Step S1: a nanowire material for generating a light source for three primary colors: red, green and blue (a craft technique of MOCVD can be utilized) grows, electropositive and electronegative tendency treatment is performed on an end, and peeling is performed after growth;

Step S2: the nanowire material for generating a light source for three primary colors: red, green and blue is respectively doped into the photocuring adhesives and the mixtures are fully stirred (including mechanical stirring or magnetic stirring or ultrasonic stirring), and the nanowire material in the photocuring adhesives is evenly dispersed to obtain a fully stirred photocuring adhesive-nanowire material adhesive body;

Step S3: the fully stirred photocuring adhesive-nanowire material adhesive body is respectively and correspondingly injected into the grids of the grid pool corresponding to sub-pixels of the three primary colors: red, green and blue, and performing photocuring, and the overflowing cured adhesive bodies are cut off by way of laser cutting after photocuring to obtain sub-pixel cured μLEDs, wherein in the process of injecting an adhesive solution mixed with the red, green and blue nanowire materials, the green and blue grid pools, the red and blue grid pools and the red and green grid pools can be shielded respectively, and the overflowing cured adhesive bodies are cut off by way of laser cutting after photocuring; and Step S4: an electrode capable of working under a condition of an alternating current is enabled to be in one-to-one-correspondence with the corresponding sub-pixel cured μLEDs on the upper and lower surfaces of the grid pool by way of attaching a chip electrode or growing the electrode, and a desired display size is cut off by way of laser cutting.

In the embodiment, the nanowire materials are different homojunction materials of homogeneous structures which grown on the silicon substrate from bottom to top and are capable of generating three primary colors: red, green and blue, the upper and lower ends of the nanowire materials are respectively n and p-doped, two end tops are respectively in electronegative tendency and electropositive tendency, and a hole electron recombination can be generated at a center of a junction of n and p homojunctions.

In the embodiment, an inner diameter of the nanowire ranges from 40 nm to 60 nm, and a length thereof ranges from 300 nm and 400 nm, thereby providing a proper contact area for carrier recombination of the pn junction so as to perform radiative transition.

In the embodiment, the S1 includes the following steps:

Step S11: the substrate is cleaned and treated: a sample is ultrasonically cleaned in sequence in deionized water, ethanol and deionized water, pollutants left on the surface are removed and the sample is blow-dried;

Step S12: the substrate is put in a reaction chamber of a physical vapor deposition device and evaporation of a nanowire buffer layer is started at a certain pressure of the reaction chamber and a temperature of a metal source to solve mismatch between the substrate and the nanowire in an axial direction, wherein the nanowire releases stress-strain caused by mismatch between substrate and crystal lattices of the nanowire material along a side surface and a direction perpendicular to a junction interface during growth, so that materials with mismatched crystal lattices can be connected in series and grow in a radial direction or an axial direction conveniently; and performing growth of an upright nanowire material after the thin film of the buffer layer grows;

Step S13: the substrate covered with the thin film of the buffer layer is putt in a multi-chip HVPE growth system, growing the nanowire is started at a low temperature by taking the substrate as a bottom, and a nanowire material source, n and p-doped gases, a reaction gas, a carrier gas and electropositive and electronegative tendency treatment are controlled, wherein the nanowire grows to become a structure of an electropositive tendency p-doped nanowire end-p-doped nanowire-n-doped nanowire-electronegative tendency n-doped nanowire end from bottom to top; and Step S14: the structure s cooled to take out a sample so as to obtain the nanowire material.

In the embodiment, for sub-pixels with different primary colors, a nanowire growth material is different direct band-gap semiconductor compounds from groups III-V. For example, blue light emitting sub-pixels are GaN, green light emitting sub-pixels are InGaN, red light emitting sub-pixels are GaAs, which is not limited thereto.

In the embodiment, the photocuring adhesive is a transparent insulating material. The photocuring adhesive, as a carrier for different nanowire materials with red, green and blue sub-pixels, is an adhesive body at a room temperature and a normal pressure, has certain mobility and can be cured at room temperature. The photocuring adhesive is the transparent insulating material with a great dielectric constant so as to realize transparent display.

The photocuring adhesive material can be used for preparing the transparent insulating photocuring adhesive capable of being quickly cured by ultraviolet light at room temperature from a main component of an oligomer of an unsaturated polyester resin, an acrylic resin and a polythiol/polyenoid resin matched with a proper diluent monomer, a photosensitizer and an auxiliary material.

In the embodiment, the grid pool is made from a transparent insulating material. The grid pool is taken as a place where a mixed solution of the photocuring adhesive and the nanowire materials is cured, and meanwhile, each of the grids is taken as a red, green and blue sub-pixel point. The grid pool is the transparent insulating material with a great dielectric constant to realize transparent display.

The electrodes are set as conducting electrodes with sub-pixel units in different primary color at an interval in sequence, and the sizes and the center positions of the electrodes are precisely matched with the sizes and the center positions of the grid pool.

In the embodiment, the grids of the grid pool are shaped like a Chinese character "kou", with a length ranged from 16 um to 32 um, a width ranged from 9 um to 18 μm and a depth ranged from 9 um to 18 um, wherein a distance between the outer wall of the grid wall and the grid pool ranges from 1 um to 3 um. The transmittance for rays with wavelengths ranged from 380 nm to 780 nm is greater than or equal to 90%. The material can be an organic material, including one or more of polyethylene (PE), polypropylene (PP), polyethylene naphthalate (PEN), polycarbonate (PC), polymethyl acrylate (PMA), polymethyl methacrylate (PMMA), cellulose acetate butyrate (CAB), siloxane, polyvinyl chloride (PVC), polyvinyl alcohol (PVA), polyethylene terephthalate (PET), polyethylene terephthalate glycol (PETG), polydimethylsiloxane (PDMS) or a cycloene copolymer (COC); or an inorganic material, including one or more of glass, quartz and a transmission ceramic material.

In the embodiment, the electrode is a material capable of working under a condition of an alternating current, including, but not limited to, graphene, PEDOT: PPS, and metals silver, platinum or gold. The electrode can be either a chip electrode or a transparent electrode material growing on the μLED subsequently. As the nanowires in the μLED in the design are evenly distributed in the adhesive body, distribution of p-end nanowires and n-end nanwores is unknown, so that the electrode material is a material capable of working under a condition of an alternating current so as to enable the carrier recombination of the pn junction to emit light.

Figure 2:
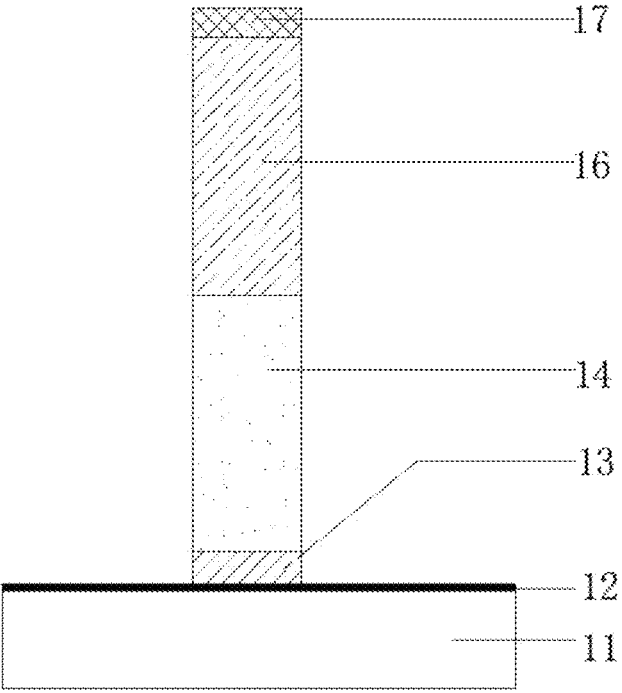
FIG. 2 is a sectional schematic diagram of a nanowire in an embodiment of the present invention.
Figure 3:
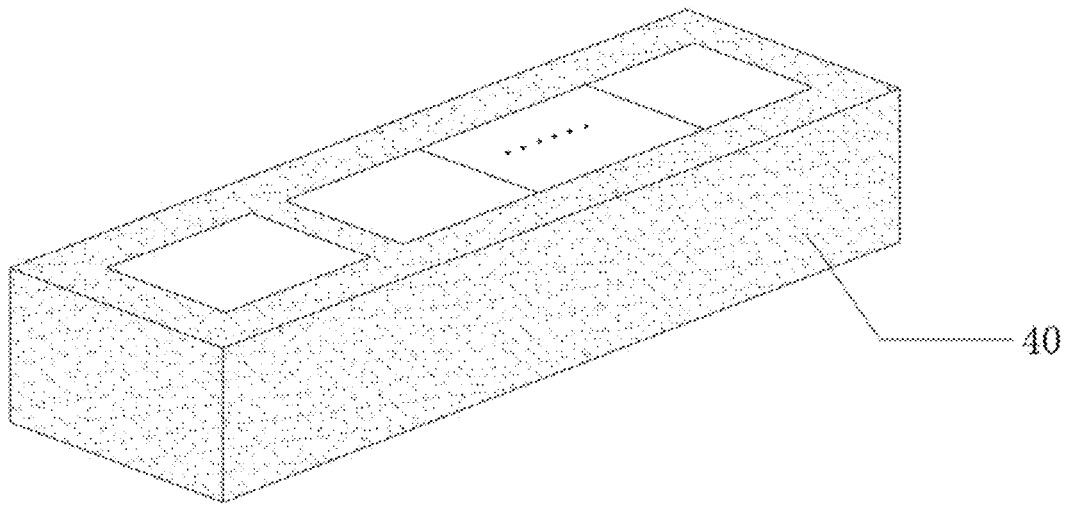
FIG. 3 is a structural schematic diagram of a grid pool in an embodiment of the present invention.
Figure 4:
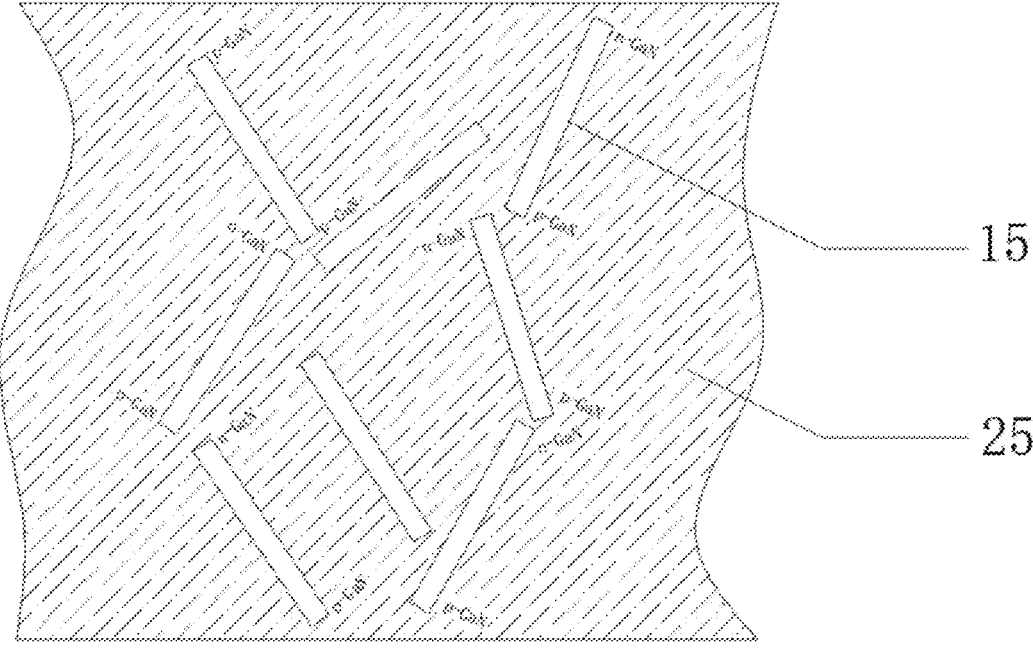
FIG. 4 is a diagram of a mixed solution of a photocuring adhesive and a nanowire in an embodiment of the present invention.

As shown in FIG. 1, 10 is the red μLED, 20 is the green μLED, 30 is the blue LED, 40 is the grid pool, 50 is the insulating part of the electrode, and 60 is the electrode. The nanowire materials for the red, green and blue μLEDs are respectively GaN, InGaN and GaAs, the electrode is the chip electrode, the insulating part is silicon dioxide, and the conducting part is Ag. As shown in FIG. 2, the nanowire grows on the substrate 11 which is silicon. The buffer layer (made from AlN) 12, the end of the nanowire with electro-positive tendency 13, the p-type doped nanowire material 14, the n-type doped nanowire material 16 and the end of the nanowire with electronegative tendency 17 grow in sequence on the silicon substrate by way of MOCVD. The nanowire material is peeled centrifugalized after growth. As shown in FIG. 3, 40 is the grid pool distributed in a rectangular shape of Chinese character "kou", with a thickness of 1 um. Each of the grids is 16 um long, 9 um wide and 9 um deep. The grid is made from a transparent silicon dioxide insulating material, and the light transmittance is greater than 90%. As shown in FIG. 4, 15 is nanowire, and 25 is photocuring adhesive which is a μV photocuring adhesive based on epoxy methacrylate resin. The carbon nanowire is evenly dispersed in the adhesive by mechanically stirring the centrifugally separated nanowire and the uV adhesive and the mixture is ultraviolet-cured to form a single primary color sub-pixel μLED.

In conclusion, the display design of μLED of the embodiment completes electron-hole recombination by utilizing the homogeneous pn junction nanowire materials to generate radiative transition. Compared with the lamellar structure, the nanowire type pn junction is lower in working voltage and higher in inner quantum efficiency. Stress-strain caused by mismatch between the substrate and crystal lattices of the nanowire can be released along the side surface and the direction perpendicular to the junction interface in the growth process of the nanowire, so that limitation by mismatch of the crystal lattices of the lamellar structure is overcome. Meanwhile, in the growth process, various micro-treatment can be performed, so that the work efficiency of the apparatus is improved. The nanowire and the photocuring adhesive are inter-dissolved and are cured in the sub-pixel grid pool after being evenly stirred, so that the structure of the lamellar μLED is simplified. When the sub-pixels are selected, electrons and holes in the insulating photocuring adhesive complete short-distance transition via quantum tunneling and are injected into the nanowire, so that the pn junction generates radiative transition. The end of the nanowire is in electropositive and electronegative tendencies to guide carriers. Thus, the μLED of the structure can work in the state of the alternating current, and the desired display size can be obtained by way of laser cutting, so that there is no problem of massive transfer, the manufacturing period of the μLED is shortened, and the market competitiveness of the μLED is improved greatly.

The above is merely preferred embodiments of the present invention and is not limitation to the present invention in other forms. Those skilled in the art may alter or modify equivalent embodiments with equivalent changes by means of the disclosed technical content. Any subtle modifications, equivalent changes and modifications made on the embodiments in accordance with the technical substance of the present invention shall come within the scope of the technical scheme of the present invention without departing the content of the technical scheme of the present invention.

What is claimed is:

1. A μLED display manufacturing method based on nanowire, comprising: growing three types of nanowire materials capable of generating three primary colors: red, green and blue on a substrate; respectively mixing the three types of nanowire materials in insulated photocuring adhesives to form three mixtures and injecting the three mixtures into different grids of a grid pool, and performing curing; and finally, arranging electrodes on upper and lower surfaces of the grid pool;

the μLED display manufacturing method based on nanowire comprises the following steps:

Step S1: growing three types of nanowire materials for generating three primary colors: red, green and blue;

Step S2: respectively mixing the three types of nanowire materials for generating three primary colors: red, green and blue into three photocuring adhesives to form three mixtures and stirring the three mixtures fully, and evenly dispersing the three types of nanowire materials in the three photocuring adhesives to obtain three types of fully stirred photocuring adhesive-nanowire material adhesive body;

Step S3: respectively injecting the fully stirred photocuring adhesive-nanowire material adhesive body correspondingly into the grids of the grid pool corresponding to sub-pixels of the three primary colors: red, green and blue, and performing photocuring, and cutting off the overflowing photocuring adhesive-nanowire material adhesive body by way of laser cutting after photocuring to obtain sub-pixel cured μLEDs; and Step S4: enabling an electrode capable of working under a condition of an alternating current to be in one-to-one-correspondence with the corresponding sub-pixel cured μLEDs on the upper and lower surfaces of the grid pool by way of attaching a chip electrode or growing the electrode, and cutting off a desired display size by way of laser cutting;

the Step S1 comprises the following steps:

Step S11: cleaning and treating a substrate;

Step S12: putting the substrate in a reaction chamber of a physical vapor deposition device and starting evaporation of a nanowire buffer layer to solve mismatch between the substrate and the nanowire in an axial direction, wherein the nanowire releases stress-strain caused by mismatch between the substrate and crystal lattices of the nanowire material along a side surface and a direction perpendicular to a junction interface during growth, so that materials with mismatched crystal lattices can be connected in series and grow in a radial direction or an axial direction conveniently;

Step S13: putting the substrate covered with the thin film of the buffer layer in a multi-chip HVPE growth system, starting growing the nanowire at a low temperature by taking the substrate as a bottom, and a nanowire material source, n and p-doped gases, a reaction gas, a carrier gas and electropositive and electronegative tendency treatment are controlled, wherein the nanowire grows to become a structure of an electropositive tendency p-doped nanowire end-p-doped nanowire-n-doped nanowire-electronegative tendency n-doped nanowire end from bottom to top; and Step S14: cooling the structure to take out a sample so as to obtain the nanowire material.

2. The μLED display manufacturing method based on nanowire according to claim 1, wherein the nanowire material is of a homogeneous structure, the upper and lower ends of the nanowire material are respectively n and p-doped, two end tops are respectively in electronegative tendency and electropositive tendency, and a hole electron recombination can be generated at a center of a junction of n and p homojunctions.

3. The μLED display manufacturing method based on nanowire according to claim 1, wherein a diameter of the nanowire ranges from 40 nm to 60 nm, and a length thereof ranges from 300 nm and 400 nm.

4. The μLED display manufacturing method based on nanowire according to claim 1, wherein for sub-pixels with different primary colors, a nanowire growth material is different direct band-gap semiconductor compounds from groups III-V.

5. The μLED display manufacturing method based on nanowire according to claim 1, wherein the insulated photocuring adhesives is a transparent insulating material.

6. The μLED display manufacturing method based on nanowire according to claim 1, wherein the grid pool is made from a transparent insulating material.

7. The μLED display manufacturing method based on nanowire according to claim 1, wherein the grids of the grid pool are rectangular in shape, with a length ranged from 16 μm to 32 um, a width ranged from 9 um to 18 um and a depth ranged from 9 um to 18 um.

8. The μLED display manufacturing method based on nanowire according to claim 1, wherein the electrodes are a material capable of working under a condition of an alternating current, the material can be graphene, PEDOT: PPS, and metals silver, platinum or gold.

* * * * *